United States Patent [19]

Ruby et al.

[11] Patent Number: 4,782,381
[45] Date of Patent: Nov. 1, 1988

[54] CHIP CARRIER

[75] Inventors: Richard C. Ruby, Menlo Park; Clinton Chao, Redwood City, both of Calif.

[73] Assignee: Hewlett-Packard Company, Palo Alto, Calif.

[21] Appl. No.: 62,005

[22] Filed: Jun. 12, 1987

[51] Int. Cl.[4] .................. H01L 23/48; H01L 29/90; H01L 39/02; H01C 1/012

[52] U.S. Cl. ........................ 357/74; 357/71; 357/70; 357/13; 357/23.6; 357/80; 338/308; 361/56; 361/402; 361/414

[58] Field of Search ............ 357/74, 70, 71, 13, 357/23.6, 80; 361/414, 402, 56; 338/308

[56] References Cited

U.S. PATENT DOCUMENTS

| | | | |
|---|---|---|---|
| 3,368,116 | 2/1968 | Spaude | 361/402 |
| 4,015,147 | 3/1977 | Davidson et al. | 361/56 |
| 4,106,048 | 8/1978 | Khajezadeh | 357/13 |
| 4,151,542 | 4/1979 | Yajima et al. | 357/51 |
| 4,258,311 | 3/1981 | Tokuda et al. | 357/13 |
| 4,627,151 | 12/1986 | Mulholland et al. | 437/220 |
| 4,714,952 | 12/1987 | Takekawa et al. | 357/70 |

OTHER PUBLICATIONS

Bodendorf, D. J., "Active Silicon Chip Carrier", IBM Technical Disclosure Bulletin, vol. 15, No. 2, Jul. 1972, pp. 656-657.

*Primary Examiner*—Martin H. Edlow
*Assistant Examiner*—Robert Limanek
*Attorney, Agent, or Firm*—Paul L. Hickman; Edward Y. Wong; William H. F. Howard

[57] ABSTRACT

A chip carrier for carrying integrated circuit chips is provided. Instead of placing individual circuit components either in the chips or next to them, the components are placed in or near the substrate of the chip carrier. This frees up expensive real-estate for logic chips at the chip level presently occupied by the components. The substrate of the carrier acts as a large heat sink to dissipate power generated by the components.

2 Claims, 6 Drawing Sheets

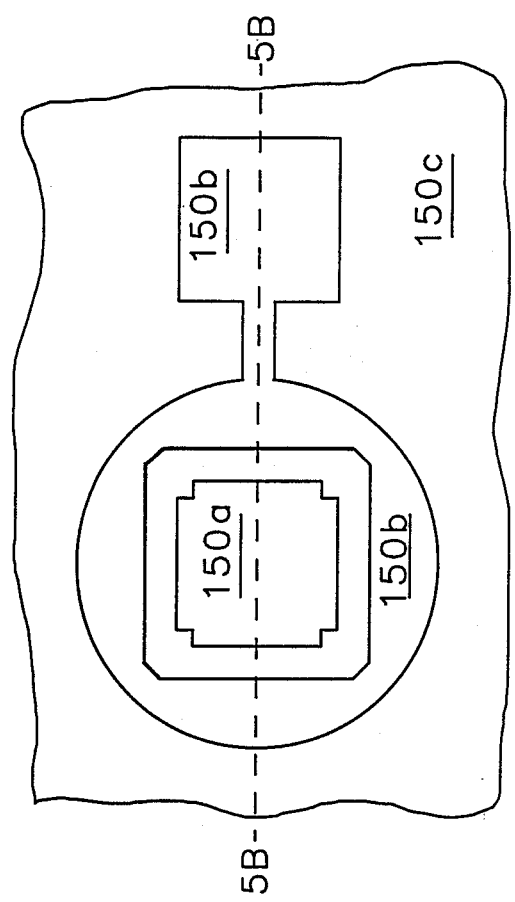
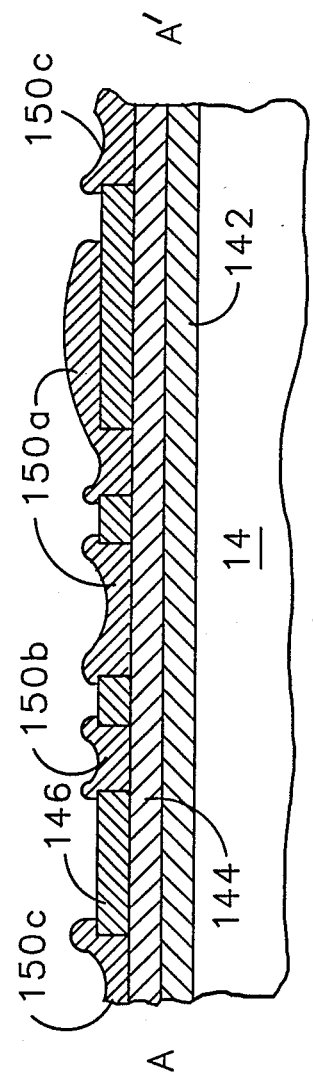

CHIP CARRIER

BACKGROUND OF THE INVENTION

This invention relates to systems for carrying integrated circuit chips (IC), and more particularly to chip carriers.

In integrated circuit manufacture, a thin slice or wafer of semiconductor material is cut into individual circuits or chips. Each chip carries a set of bonding pads through which the chip must be connected to other chips and to the outside world. Each chip is then individually packaged. The package for the chip has package leads and a connection is made between each bonding pad of the chip and the corresponding package lead. Perhaps the most familiar chip package is the Dual In-Line Package or DIP in which a majority of integrated circuits are packaged in. Further external connections are then made between packaged leads, such as by ready-made connections on a printed circuit board upon which the individually packaged chips are mounted.

Another system used for connecting the bonding pads of chips to those of other chips or to the outside world is known as the chip carrier. A chip carrier is typically made of a substrate which is used as a base upon which is placed a sandwich-like structure composed of electrically insulating and conducting layers in an alternating arrangement to facilitate different types of electrical connections. The sandwich structure usually includes several layers of metal interconnect lines and power/ground planes sandwiched packaged. Instead the chips are turned upside down so that their bonding pads face downwards. In such a configuration, the chips are known as flip chips. The bonding pads are then connected to the sandwich structure through solder bumps. The solder bumps for a particular chip may be connected through via holes through one or more insulating layers of the structure to the desired interconnect lines or power/ground planes. In the introduction of U.S. Pat. No. 4,458,297, Stopper et al. there is a description of an interconnect structure of the type described above. The advantage of chip carriers over printed circuit boards is that the IC chips can be placed closer together on a chip carrier than on a printed circuit board.

As very large scale integration (VLSI) becomes more widely used om systems, VLSI circuit packages must be capable of handling large numbers of inputs and outputs and the packages must be capable of being cooled at an acceptable rate. In many systems it is desirable to use, in conjunction with the manufactured integrated circuit chips, certain circuit components such as resistors, capacitors, diodes and transistors for various functions. For very high speed computer applications, for example, electrical signal lines that exist between logic chips should be terminated in resistors. In conventional systems, resistors used for terminating the signal lines may form part of a larger chip; alternatively, a discrete resistor placed next to the chip may also be used. In either case the power dissipated by the resistor increases the amount of heat generated in the chip. The alternative of placing resistors next to the IC chip takes up valuable real estate. In VLSI circuits, a large number of chips are packed into a small area so that the amount of heat generated by the chips or in their vicinity is of critical concern. It is therefore desirable to provide a chip carrier which can be used to alleviate such difficulties.

SUMMARY OF THE INVENTION

This invention is based on the recognition that, instead of placing the individual circuit components either in a chip or next to it, they may be placed instead at or near the substrate of a chip carrier. Thus, the component would then be separated from the IC chip by the alternating insulating and conducting layers of the interconnect structure. In addition, the substrate of the carrier acts as a large heat sink to dissipate power generated by the components. Moving the components from locations near the logic chips to the substrate level opens up more space for the logic chips at the chip level presently occupied by such components. Hence the expensive space at the IC chip level can be used more economically.

This invention is directed towards refinements on a chip carrier used for carrying integrated circuit chips. The carrier comprises of a substrate means having a surface and at least one component structure on the surface of the substrate means or forming a part of the substrate means at its surface. The carrier further comprises of integrated circuit contact means connected to said at least one component structure and sandwich means including at least one insulating and one conducting layer in an alternating arrangement. The sandwich means is in contact with and covers at least a portion of the contact means and the surface. The sandwich means has a surface suitable for carrying integrated circuit chips. Vias created in the sandwich means connect the input/output pads of an IC chip to components on the silicon carrier substrate. Another aspect of the invention is directed towards a resistor which comprises a layer of a resistive material and a first contact comprising a sheet of an electrically conductive material in contact with the layer. The resistor further comprises a second contact comprising an annular sheet of an electrically conductive material in contact with the layer and surrounding the first contact. The perimeters of the first and second contacts adjacent each other are substantially circular and concentric with each other, said adjacent perimeters defining between them a substantially circular ring of the layer of resistive material. This forms a topology consisting of multiply connected domains. The resistance of the resistor is substantially given by $2\pi R \ln(b/a)$, where R is the sheet resistance of the resistive layer and and a and b are respectively the inner and outer radii of the circular ring of the the layer of resistive material.

As discussed above, resistors are frequently needed near an IC chip. The need for capacitors near the IC chip is just as critical or perhaps more so. One drawback to VLSI chips is the number of simultaneously switching devices (NSSD) on that chip. The penalty occurs when the change in the current with respect to time becomes large. This penalty is in the form of a voltage drop at a point on the power plane near the chip. This voltage drop can be written as $$V = nL dI/dt,$$

where n is the number of switching devices and L the inductance between the chip and the nearest bypass capacitor on power plane.

The inductance, L, increases proportionally to the distance between the chip and the bypass capacitor. By placing the bypass capacitor directly underneath the mounted IC chip, two advantages accrue: (1) the inductance is minimized and (2) real-estate on the top surface is gained through the elimination of the surface mounted capacitors.

At high frequencies (past the resonant frequency of the bypass capacitor) the capacitor begins to look like a large inductor. This inductance, unfortunately, acts like an open circuit to any ac voltage drops. Another aspect of this invention is to replace capacitors (which act primarily as a charge storage device) with a punch-through diode (which acts as a current steering device). [see D.De Cogan, "The Punch-Through Diode", Microelectronics 8, 20 (1976)]. The diode(s) would then act as shunt-regulators. In the case of the punch-through diode (a majority carrier device) the response time is known to be in the microwave region; thus, an ac voltage drop on the power plane due to the simultaneously switching devices on an IC chip can be compensated by the diode. There can be a situation where both capacitors and shunt PTD diodes will exist on the same chip carrier substrate.

Another component that can exist in the chip-carrier substrate are bipolar drivers. Many VLSI chips today are made from CMOS technology. Whereas CMOS has many advantages (high density, low power etc.) it has some distinct disadvantages. These disadvantages include the inability of the off-chip drivers (i.e. those CMOS transistors whose duty is to drive signals of the VLSI chip) to drive large RC dominated lines. This is not a problem when using bipolar drivers. Currently, there is much interest in BICMOS (bipolar and CMOS on a chip), however, this may compromise both devices when fabricated on the same chip. Another approach is to place the bipolar chips into the silicon chip carrier. This allows one to optimize the CMOS process for the CM0S VLSI chips and the bipolar drivers on the chip carrier.

Another aspect of this invention is the use of boron nitride (BN) as the dielectric for the capacitor. The dielectric is relatively high (5–7) and the coverage is very good. Chemical vapor phase deposited BN and its subsequent patterning can blend well with the existing IC processing.

Another aspect of this invention relates to the use of an evaporated nickel metal interlayer above the aluminum. The aluminum, which alloys well with silicon and hence acts as an ohmic contact to the polysilicon resistors, is attacked by the etchant used to remove the polyimide patterning mask. The polyimide patterning mask is, itself, aluminum. By using a thin (i.e. about 1000 A) layer of nickel on top of the contact aluminum, this aluminum layer is protected.

Another aspect of this invention is the use of punch-through diodes PTD on the silicon substrate as shunt regulators. Thus, the active chip carrier provides current steering as opposed to substrates containing capacitors which act as charge storage devices. The advantage is that the diode (a majority carrier device) can work at microwave frequencies while still providing the necessary amount of current.

BRIEF DESCRIPTION OF THE DRAWINGS

FIG. 5A is a top view of a portion of the substrate and a component structure of the carrier of FIG. 3 to illustrate a second alternative embodiment of a resistor pair.

FIG. 5B is a cross-sectional view of the portion of the carrier in FIG. 5A taken along the line 5B—5B in FIG. 5A.

DETAILED DESCRIPTION OF THE INVENTION

Figure 1:
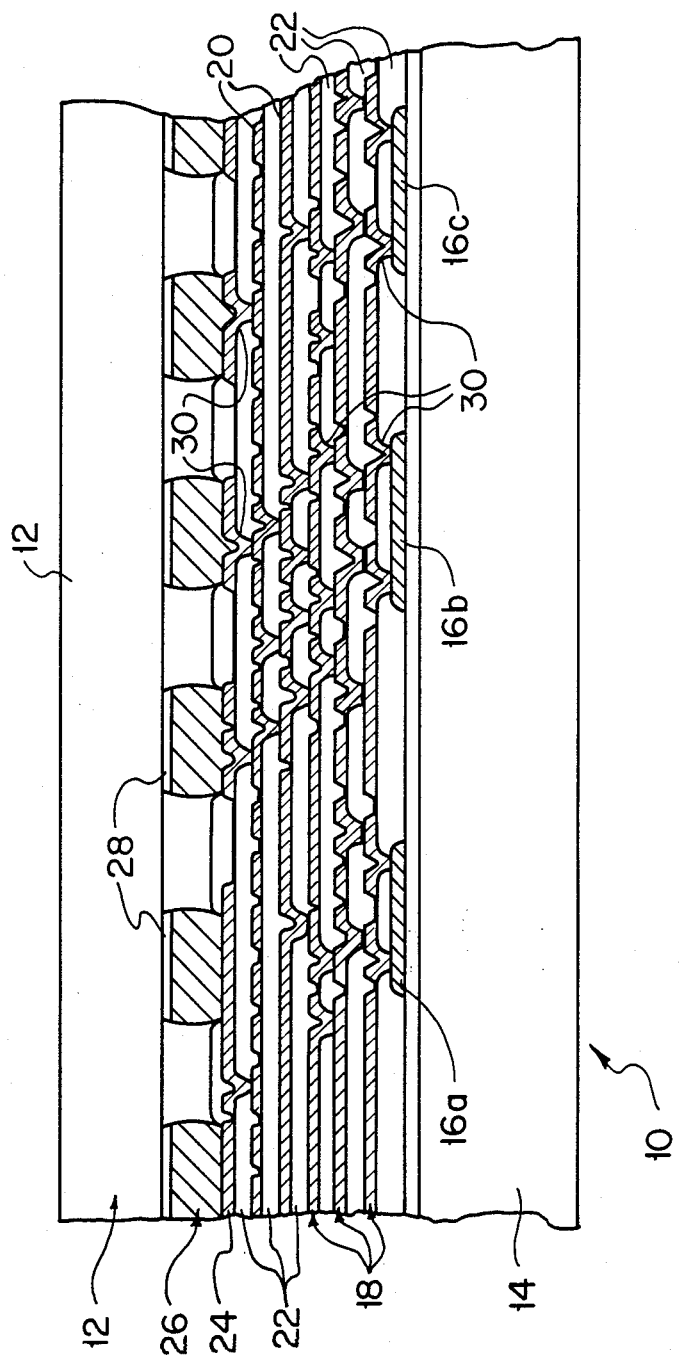
FIG. 1 is a cross-sectional view of a portion of a chip carrier and a portion of a chip carried by the carrier to illustrate the invention.

FIG. 1 is a cross-sectional view of a portion of a chip carrier 10 and a portion of an integrated circuit chip 12 carried by carrier 10. Chip carrier 10 comprises a substrate 14 which is used as a base upon which a sandwich-like structure is placed. The sandwich structure includes several layers of power/ground planes 18 and metal interconnect lines 20, sandwiched between insulating layers 22. On top of the top insulating layer of the sandwich-like structure is placed a solder land layer 24 to facilitate connection to the bonding pads of chip 12. Solder bumps 26 are used for soldering the bonding pads 28 to the solder lands 24. Vias 30 are used for connecting a particular bonding pad 28 through a solder bump and a solder land area to a particular interconnect line 20, a power/ground plane 18 or to a particular circuit component structure 16. Such via means are conventional and are described, for example, in Mukai, K., et al., I.E.E.E. Journal of Solid State Tech. V. Sc-13 #4 1980, p. 462.

Circuit components 16a, 16b, 16c useful for systems employing integrated circuit chips are placed away from the chips and beneath the sandwich-like structure. As shown in more detail in FIG. 2 discussed below, circuit component structure 16a includes a resistor and a diode, structure 16b includes a capacitor and structure 16c a transistor. The resistor in structure 16a may be used for terminating a signal line connected to chip 12. For very high speed computer applications, electrical signal lines between logic chips should be terminated in resistors. If such lines are not so terminated, high frequency signals present in such lines will be reflected causing a phenomenon known as ringing. Thus, if the signal lines are not terminated, a receiver will have to wait until the ringing stops before data is considered reliable. This is of course undesirable. The signal lines between logic chips are therefore usually terminated in resistors with resistances that matches the impedance of the lines in order to minimize ringing. Termination resistors can also be used in a "source termination" configuration. There, a resistance pair is used as a combination pulldown resistor (to keep bipolar transistors in the on state) and a series damping resistor designed to damp out reflections.

In many applications, it may be desirable to provide a charge reservoir for the chip 12. In such event, it may be desirable to connect chip 12 through vias to the capacitor in structure 16b. Where it is desirable to steer current from the chip, chip 12 may be connected through vias to the diode in structure 16a where the diode functions as a shunt regulator for the chip. It may also be desirable to drive chip 12 by means of the transistor in structure 16c also connected to the chip by vias.

The power dissipation by circuit components such as resistors, diodes or drivers can be quite high. In conventional chip carriers, such circuit components are either included as part of the chip or placed as discrete components near the larger chips. In either case, these components are located on top of the alternating interconnect conducting and insulating layers and adds to the heat generated by the chips themselves. The heat generated by such components may adversely affect the operation of the chips and may impose a constraint for the density of chips that can be placed in a given area. In contrast, the circuit components in the chip carrier of this invention are placed beneath the alternating conducting and insulating sandwich-like structure away from the chips. These component structures may be deposited on top of the substrate 14. Alternatively, these structures may form a part of substrate at the top surface of the substrate carrying the sandwich structure.

Figure 2:
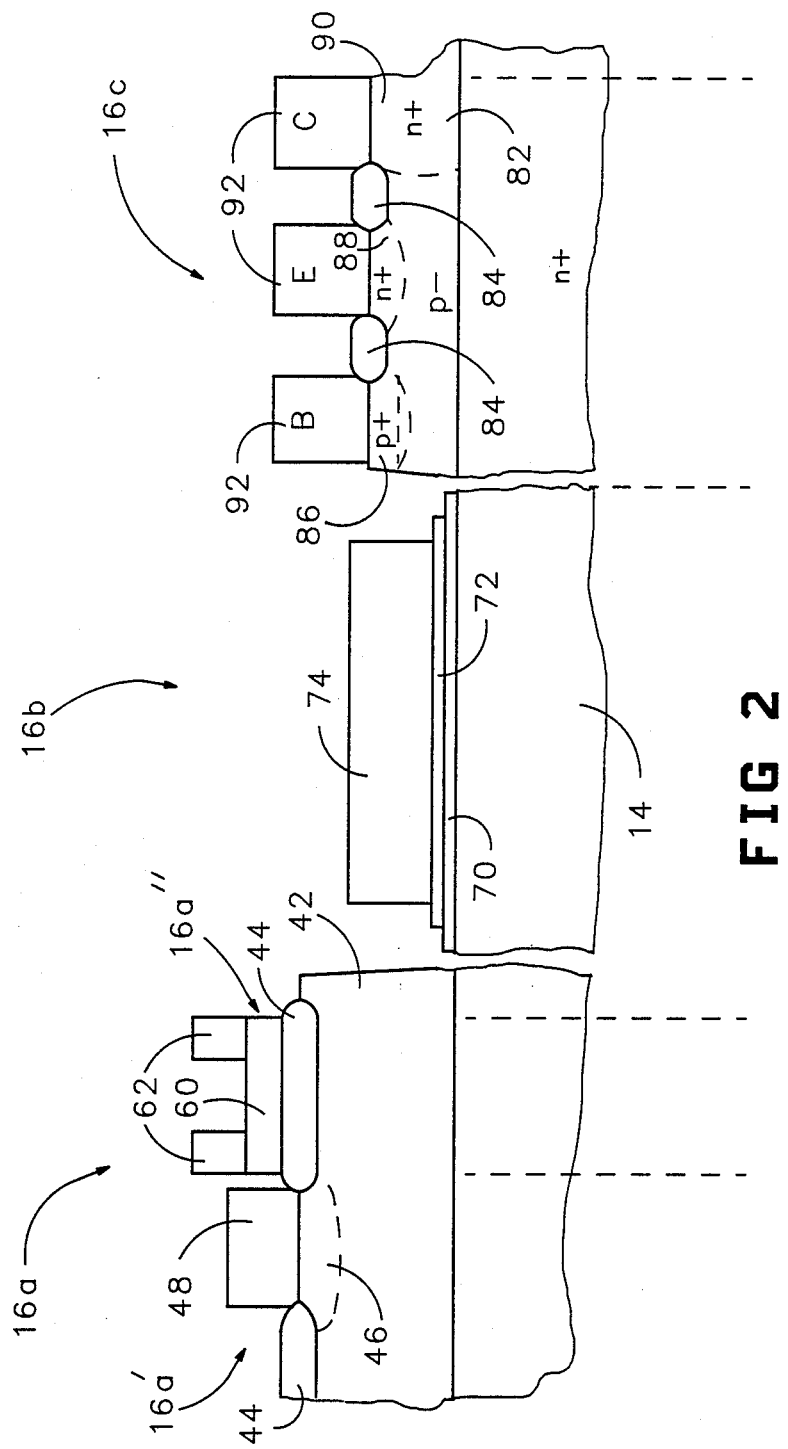
FIG. 2 is a cross-sectional view of a portion of the chip carrier of FIG. 1 including certain a part of the substrate and certain circuit component structures to illustrate the preferred embodiment of the invention.

FIG. 2 is an enlarged view of portions of the substrate 14 and of the component structures 16a, 16b, 16c to illustrate the invention. As shown in FIG. 2, component structure 16a includes a diode 16a' and a resistor 16a''. A layer 42 of p− epitaxial silicon is first grown on top of a substrate 14 which may be made of n+ silicon. A layer of silicon dioxide 44 is then formed on top of layer 42, such as by oxidizing a selected top area of layer 42. A diode may then be formed by implanting n-type dopants in the top of layer 42 forming an n+ type layer 46. Metal contact 48 in electrical contact with layer 46 then connects the diode to the chip through vias 30.

Resistor 16a'' comprises a resistive layer 60 and two metal contacts 62 on top of and in contact with layer 60 but spaced apart from each other. Thus, the portion of layer 60 between the two contacts 62 functions as a resistor. Therefore a signal line connected to chip 12 may be terminated by connecting the line to one of the two contacts 62.

Capacitor structure 16b comprises a conducting layer (e.g. silicide or metal layer) 70 on top of substrate 14. A dielectric layer 72 (e.g. boron nitride) is placed on top of layer 70 and another conducting layer 74 on top of the dielectric layer. Layer 74 may be made in a shape which serves conveniently as a contact for connection to the chip 12 through vias 30.

Transistor structure 16c comprises a p− epitaxial silicon layer 82 grown on top of substrate 14. A silicon dioxide layer 84 is formed on top of layer 82 and dopants are implanted to form the n+, p+, n+ layers 86, 88 and 90 at the top surface of layer 82 as shown in FIG. 2. Metal contacts 92 connected to layers 86, 88, 90 then form the drain, gate and source of transistor 16c. Transistor 16c may be conveniently used to drive chip 12; transistor 16c may be connected to chip 12 by connecting contacts 92 to the appropriate bonding pads through vias 30.

While in FIG. 2 the diode and transistor are shown as structures on top of and distinct from the substrate, it will be understood that they may be part of the substrate formed by implanting the appropriate ions into the substrate at its surface in a conventional manner. All such configurations are within the scope of the invention.

Figure 3A:
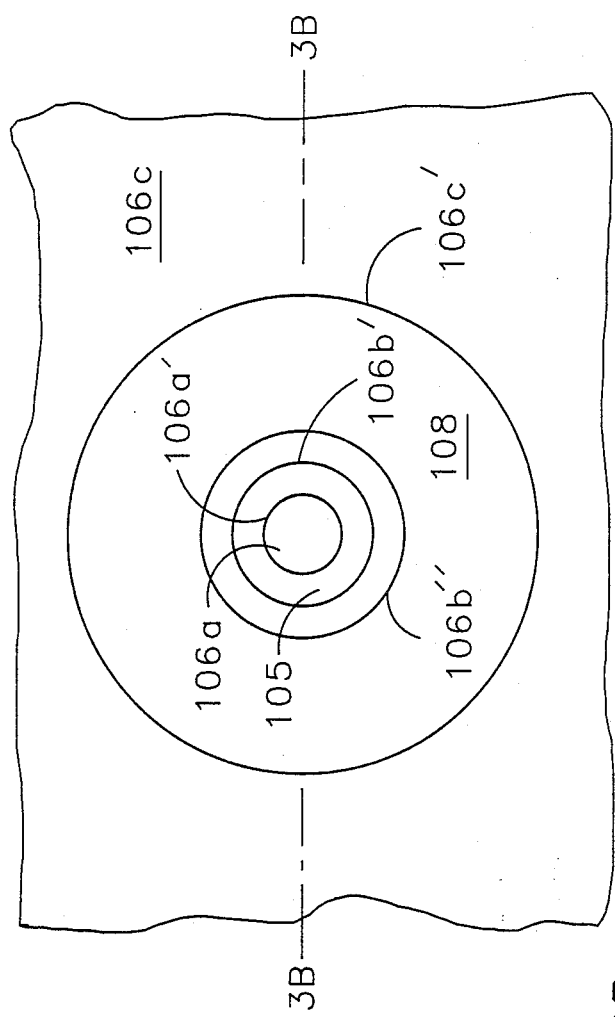
FIG. 3A is a top view of a portion of the carrier of FIG. 1 to illustrate the preferred embodiment of a resistor pair.
Figure 3B:
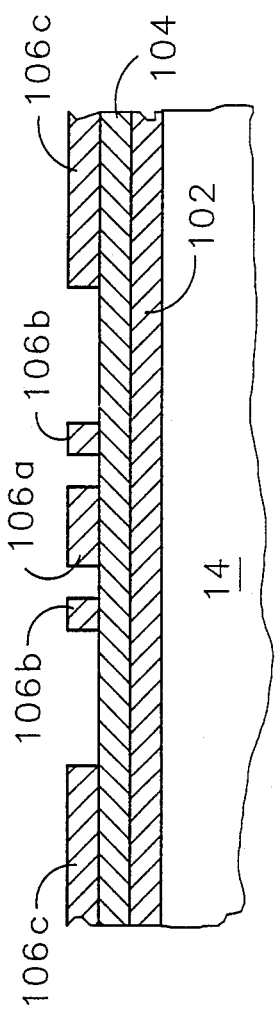
FIG. 3B is a cross-sectional view of the portion of the carrier taken along the line 3B—3B in FIG. 3A.

FIG. 3A is a top view of another configuration of the resistor portion of component 16a of FIG. 1 illustrating the preferred embodiment of the invention. FIG. 3B is a cross-sectional view of the resistor of FIG. 3A taken along the line 3B—3B in FIG. 3A. As shown in FIGS. 3A, 3B, the resistor portion 16a'' comprises an insulator layer 102, a resistive layer 104 and metal contacts 106a, 106b and 106c on top of the substrate 14. As shown in FIG. 3A, contact 106a is completely surrounded by contact 106b, contact 106b being substantially annular in shape. In the preferred embodiment, the perimeters of contacts 106a, 106b adjacent to each other are substantially circular and are substantially concentric. Specifically, perimeter 106a' and perimeter 106b' are substantially circular and concentric. These two perimeters enclose and define between them an area 105 of the resistive layer 104 which is substantially in the shape of a circular ring. Such area of layer 104 forms a resistor whose resistance is given by:

$$2\pi R \ln(b/a);$$

where R is the sheet resistance of the resistive layer 104, b is the radius of perimeter 106b' and a is the radius of perimeter 106a'. The advantage of the above-described resistor is that it has substantially no inductance, a feature which may be advantageous for certain applications. Furthermore, since the resistor is simply formed by placing the metal contacts 106a, 106b at the appropriate locations, no extra processing step is required for selecting an appropriate pattern of the resistive layer 104. This reduces the cost of manufacture.

In a similar manner, the outer perimeter 106b'' of contact 106b and the inner perimeter 106c' of contact 106c define between them an annular ring 108 of the resistive layer forming another resistor connected in series with the resistor formed by contact 106a, contact 106b and the area 105 of the resistive layer between such two contacts. If perimeters 106b'' and 106c' are circular and are concentric, the resistance of the resistor formed by contacts 106b, 106c and the circular ring of the resistive layer in between is defined in the same manner as described above.

Figure 4:
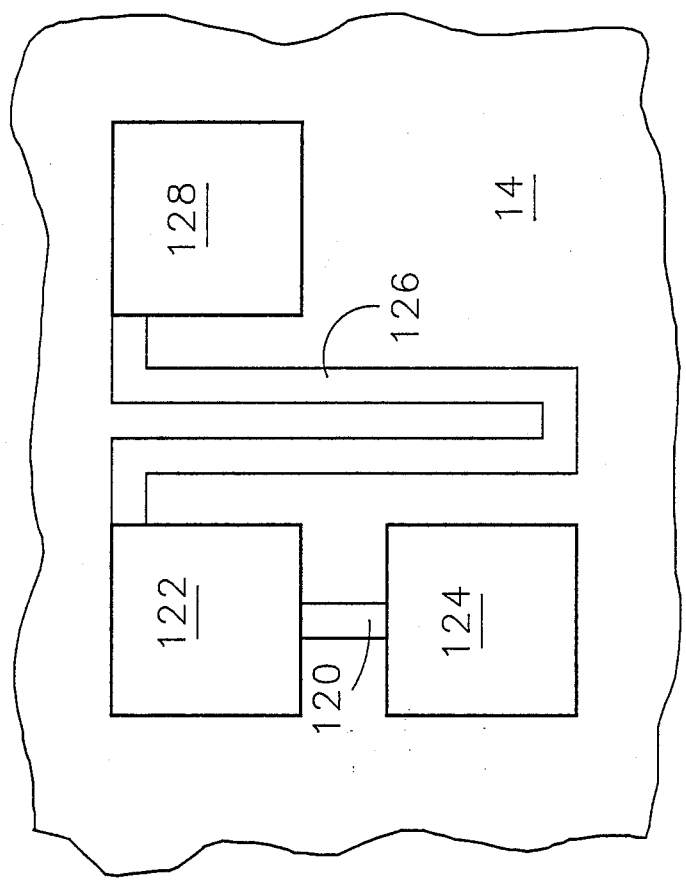
FIG. 4 is a top view of a portion of the substrate and the component structure of the carrier of FIG. 1 to illustrate an alternative embodiment of a resistor pair.

FIG. 4 is a top view of another configuration of the resistive portion of component 16a of FIG. 1 illustrating a first alternative embodiment of the resistor. Two resistors connected in series are shown in FIG. 4: one comprising a resistive layer 120 having two ends connected at each end to two conductive contacts 122, 124 and the other resistor comprising a resistive layer 126 forming a path having two ends with each end connected to one of the two contacts 122, 128. The resistance between contacts 122, 124 is determined by the length and width of layer 120. If the resistive material in layer 120 is R Ohms per square, then 35 squares are needed for a 350 Ohms resistor. As seen in FIG. 4, the resistive layers 120, 126 are patterned, unlike resistive layer 104 of FIGS. 3A, 3B.

Irrespective of the geometry of the resistor, an array of resistors covering the complete active area of the chip carrier may be employed. Alternatively, resistors may be placed every where over the sustrate such that the bonding pads of each logic chip has a resistor directly underneath.

FIG. 5A is a top view of yet another configuration of the resistor portion of component 16a of FIG. 1 illustrating a third alternative embodiment for the resistor. FIG. 5B is a cross-sectional view of the resistor portion of FIG. 5A taken along the line 5B—5B. Similar to the resistors of FIGS. 3A, 3B, the annular portion of the resistive layer 144 defined by the perimeters of contacts 150a, 150b adjacent to each other and the two contacts form a resistor. As shown in FIGS. 5A, 5B, contact 150b may be extended on top of the insulator layer 146 to facilitate its connection through chip 12 through the vias 30. Since contact 150b extends over the insulator layer 146 without coming in contact with the resistive layer, such extension does not affect the resistance of the resistor.

Figure 6B:
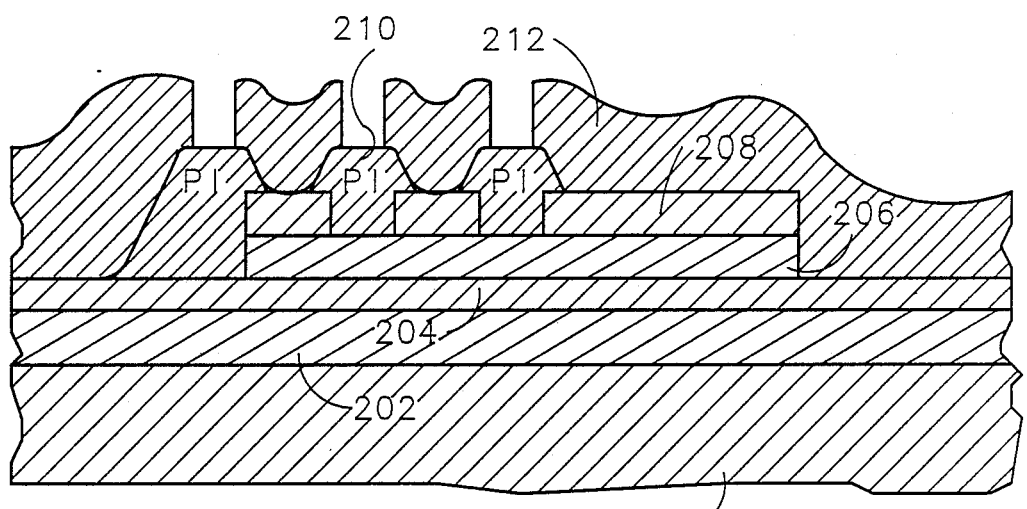
FIG. 6B is a cross-sectional view of the carrier portion of FIG. 6A taken along the line 6B—6B in FIG. 6A.
Figure 6A:
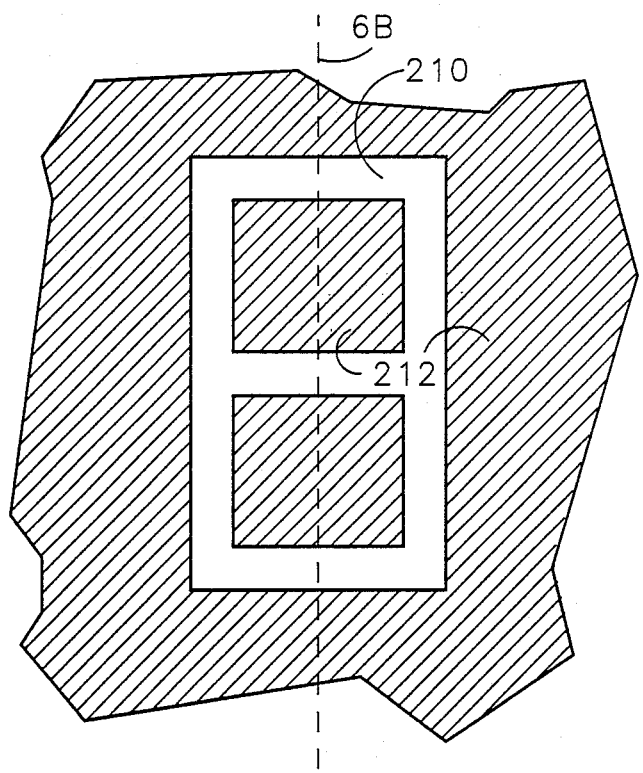
FIG. 6A is a top view of a portion of the substrate and a resistive component structure illustrating a preferred process for making a resistor pair.

FIG. 6 is a top view of the still another configuration of the resistor portion of component 16a of FIG. 1 to illustrate the processing steps for constructing the component. FIG. 6B is a cross-sectional view taken along the line 6B—6B in FIG. 6A. As shown in FIG. 6B, a silicon dioxide layer 202 is first grown on top of a silicon substrate 14. A $Si_3Ni_4$ layer may be employed to protect the silicon surface during a subsequent polyimide etching described below. A patterned polysilicon layer is employed as the resistive layer 206. An aluminum/nickel layer is patterned on top of the polysilicon to insure good contact between the polysilicon and the layers above, and to insure good control over the resistive values of the resistors. Selected areas of the aluminum/nickel layer is then etched and a three micron thick layer of polyimide 210 is then deposited. Finally, a chrome/copper layer is deposited to form the context for the resistor.

The above described apparatus and construction are merely illustrative thereof and various changes in the details thereof may be within the scope of the appended claims.

We claim:

1. A chip carrier for carrying integrated circuit chips, said carrier comprising:
   substrate means having a surface;
   at least one component structure on the surface or forming a part of the substrate means at the surface of the substrate means;
   integrated circuit contact means connected to said at least one component structure;
   sandwich means including at least one insulating and one conducting layer in an alternating arrangement, said sandwich means being in contact with and covering at least a portion of the contact means and the surface, said sandwich means having a surface suitable for carrying integrated circuit chips; and
   via means within said sandwich means for connecting the contact means to integrated circuit chips carried by the sandwich means, thereby coupling at least one component structure to the chips;
   wherein said component structure comprises a sheet of a resistive material, said contact means comprising two contacts spaced apart from each other but both in contact with the sheet of resistive material, so that when an integrated circuit chip is connected to one of the two contacts by the via means, the portion of the sheet between the two contacts functions as a resistor for terminating signals from the chip;
   wherein one of the two contacts completely surrounds the other contact, so that the portion of the sheet functioning as a resistor comprises a continuous band between the two contacts.

2. A resistor comprising:
   a layer of a resistive material;
   a first contact comprising a sheet of an electrically conductive material in contact with the layer; and
   a second contact comprising an annular sheet of an electrically conductive material in contact with the layer and surrounding the first contact, wherein the perimeters of the first and second contacts adjacent each other are substantially circular and concentric with each other, said adjacent perimeters defining between them a substantially circular ring of the layer of resistive material, wherein the resistance of the resistor is substantially given by:

$$2 R \ln(b/a);$$

where
R is the sheet resistance of the resistive layer; and
a and b are respectively the inner and outer radii of the circular ring of the layer of resistive material

* * * * *

UNITED STATES PATENT AND TRADEMARK OFFICE
CERTIFICATE OF CORRECTION

PATENT NO. : 4,782,381

DATED : November 1, 1988

INVENTOR(S) : Richard Ruby and Clinton Chao

It is certified that error appears in the above-identified patent and that said Letters Patent is hereby corrected as shown below:

Column 1, Line 33, "...sandwiched packaged" should read --- sandwiched between insulating layers. The IC chips are not individually packaged." ;

Column 1, Line 50, "om systems," should read --- in systems, ---.

Signed and Sealed this

Fifteenth Day of January, 1991

Attest:

HARRY F. MANBECK, JR.

*Attesting Officer*  *Commissioner of Patents and Trademarks*